United States Patent [19]

Rhodes

[11] 4,290,018

[45] Sep. 15, 1981

[54] MAGNETIC FIELD STRENGTH MEASURING APPARATUS WITH TRIANGULAR WAVEFORM DRIVE MEANS

[75] Inventor: Melvin H. Rhodes, Cedar Rapids, Iowa

[73] Assignee: Rockwell International Corporation, El Segundo, Calif.

[21] Appl. No.: 68,831

[22] Filed: Aug. 22, 1979

[51] Int. Cl.³ ............................................ G01R 33/04
[52] U.S. Cl. .................................................. 324/255
[58] Field of Search ................................ 324/253–255

[56] References Cited

FOREIGN PATENT DOCUMENTS 1207313 9/1970 United Kingdom ............... 324/253
1248567 10/1971 United Kingdom ............... 324/253

OTHER PUBLICATIONS

Ling, "Fluxgate Magnetometer for Space Application", 3/1964, J. Spacecraft, vol. 1, No. 2, pp. 175–180.

Primary Examiner—Gerard R. Strecker
Assistant Examiner—Walter E. Snow
Attorney, Agent, or Firm—Bruce C. Lutz; Richard A. Bachand; H. Fredrick Hamann

[57] ABSTRACT

A magnetic field directional magnetic sensor wherein the magnetic material has a large length-to-diameter ratio and comprises two coils wound around the magnetic material which also have a small diameter compared to the length. A first coil is driven with a triangular waveform signal. After each occurrence of saturation, a voltage will be produced by the output coil. The voltage amplitude of the drive signal can be measured upon the occurrence of each of the output pulses from the second coil with the measuring or detection of the drive signal being used in a sample and hold circuit which averages the detected values for a determination of magnetic field being sensed in the longitudinal or long direction of the magnetic sensor.

4 Claims, 12 Drawing Figures

MAGNETIC FIELD STRENGTH MEASURING APPARATUS WITH TRIANGULAR WAVEFORM DRIVE MEANS

The present invention is generally directed to electronics and more specifically to a magnetic sensor for measuring magnetic fields in the longitudinal direction or axis of the sensor. Even more specifically, it is directed to a magnetic sensor wherein the magnetic material has a long length-to-diameter ratio and the coils wound around the circumference thereof for activating the sensing apparatus are also small compared to the length of the magnetic material.

There are many types of magnetic field strength sensors in the prior art. In fact, I have several co-pending applications such as Ser. Nos. 068,840, 068,839 and 068,838 which are assigned to the same assignee as is the present invention and have the same filing date as the present invention.

However, most of the prior art has required relatively bulky sensors and/or complicated electronics in order to perform the field strength sensing function.

The present sensor uses a magnetic core in the form of a rod which has a length-to-diameter ratio which is large and in one embodiment of the invention is around 200. This same type sensor is used in the cases referenced above. The magnetic core has one coil wound on top of the other where each of the coils also has a small diameter compared to the length of the core. In one embodiment of the invention, the magnetic material used in the core was of a nickel iron type that generally has a permeability in the order of 100,000 until it saturates and then the permeability drops to 1,000 or less. The principle of this sensing circuit lies in determining the excitation component of fields necessary in each direction to drive the core to a condition such that the incremental permeability is reduced below a specific value. The difference in the two field magnitudes necessary to accomplish this feat will indicate the direction and the magnitude of an external field which is affecting the performance of the sensor.

Part of the concept of the present invention is the use of a rod of magnetic material of such a design that the magnitude or strength of the field being sensed significantly affects the magnitude of the excitation field required to produce a saturation of the magnetic core. An external field in the longitudinal direction of the core will require that the excitation field magnitude required to produce a given level of saturation will be different in one direction than in the other by a magnitude equal to twice the component of the external field affecting or acting upon the core. By definition in this application, saturation is when the incremental permeability of the core drops below a given value. The excitation field is produced by current in a winding on the rod or core with the current changing at a given and constant rate so that the induced voltage is greater than a specified value as long as the core incremental permeability is greater than a given specified value. The excitation field is reversed on a periodic basis with the excitation being such that saturation always occurs in one direction of excitation and normally occurs in both directions of excitation. On a slightly different aspect of the present invention, it has been determined that if a magnetic rod is used with a very large length-to-diameter ratio, or in other words, very long compared to its diameter, its permeability at the center of the core will be very nearly equal to the permeability of the core material. The field acting on the center of the core is given by the equation:

$$H = H_0 - \frac{N(B-H)}{4\pi}$$

where H is the field acting at the center of the rod, $H_0$ is the field in the sensing apparatus, $N/4\pi$ is the demagnetizing factor as determined from a set of data which may be found on page 846 of the book, "Ferromagnetism" by Bozorth published in 1951 by D. Van Nostrand Company, Inc., where $\mu$ is much larger than 150, and m is the length-to-diameter ratio of the magnetic rod. For an m ratio of 200 to 1, the value of $N/4\pi$ is 0.0001.

For the present invention, the interest is focused on the change of incremental permeability as the core goes into saturation. The permeability of the core material when using a high-mu 80 material will change from 100,000 to 1,000 as the field across the material is increased. As set forth in the referenced book by Bozorth, $$1/\mu' = 1/\mu + N/4\pi$$

where ($\mu'$) is the apparent permeability, ($\mu$) is the permeability of the material, and $N/4\pi$ is the demagnetizing factor provided in the material of FIG. 19-4b on page 847 of the referenced book.

It has been found by calculations, that for m=200 and $N/4\pi=0.0001$, that where $\mu$ equals 100,000, $\mu'$ equals 9090, where $\mu$ equals 10,000, $\mu'$ equals 5,000 and where $\mu$ equals 1,000, $\mu'$ equals 909.

In practicing the invention, it has been found that the field required to decrease the permeability of the core material to 5,000 requires about 0.1 oersted and the earth's field maximum value is approximately 0.6 oersteds. Since the two fields can sum, the drive capabilities for the core will be 0.7 oersteds maximum plus the demagnetizing factor $N/4\pi$ as determined by the above reference. Although it is not believed necessary to provide the calculations, it has been found that the field at the center of a coil, with a long length-to-diameter ratio is:

$$H_0 = 1.26 NI$$

where N is the turns per centimeter for the coil, $H_0$ is the field in the sensing apparatus as previously indicated and I is the current in the coil. If number 40 wire is used and the turns per centimeter are about 100, the resultant peak current required is approximately 0.0246 amperes. The peak-to-peak current requirement will be in the range of 0.04 amps. If it is desired that the frequency be approximately 400 hertz for excitation as in the preferred embodiment, then the rate of change for the current should be 0.040÷by 0.00125 or approximately 31.7 amperes per second rate of change.

The preferred embodiment of the present invention uses a triangular excitation current signal to provide the excitation field. This produces a linear change of current through a coil that has a small diameter-to-length ratio for the magnetic material enclosed therein. Due to characteristics of the magnetic material coacting with the coil, the output signal will occur during the maximum permeability period of the core. The presence of an external magnetic field will alter the time symmetry relative the excitation current of the occurrence of maximum permeability. This alteration will reduce or increase the time between two specific pulses depending upon the direction of the external magnetic field relative to the direction of the field as generated or induced by the excitation coil. The magnitude of the alteration is dependent upon the magnitude of the external magnetic field.

In view of the above, the present invention uses logic circuitry to measure the time delay or time symmetry for a determination of the magnetic field. The preferred embodiment measures the permeability near the zero crossing of the excitation field and the output signal from the coil. However, it will be apparent that other reference points may be utilized.

Since very small magnetic fields must be measured, it is desirable to have the measuring apparatus be as sensitive as possible. Thus, the unit is made very sensitive and the detected delay alteration is supplied to an integrator which retains a total history of the sensing unit. The output of the integrator is then used as a feedback signal to substantially exactly counteract the effects of the external magnetic field whereby the delay being detected by the circuitry at any given moment in time is normally very minimal. On the other hand, the integrator output, since it represents the total history of the sensing unit, provides an indication of the total magnetic field in the area of the sensing device.

As will be observed from a reading of the specification, the integrating device may be either analog or digital in the practice of the invention. As used in this specification, saturation is defined as a condition of the magnetic core wherein a given change in the field H produces a very small change in magnetic flux B as compared to the change in magnetic flux B for the same change in magnetic field H when there are comparatively few lines of flux in the core. It is to be realized, therefore, that while many definitions of saturation use this meaning, true saturation could also be defined as the point at which there is no further change in permeability with large changes in field intensity. The change in flux density per unit change in field as used herein will be defined as incremental permeability.

In view of the above, it is an object of the present invention to provide an improved magnetic field strength sensing apparatus.

Other objects and advantages of the present invention will be apparent from a reading of the specification and appended claims in conjunction with the drawings wherein:

DETAILED DESCRIPTION

Figure 1:
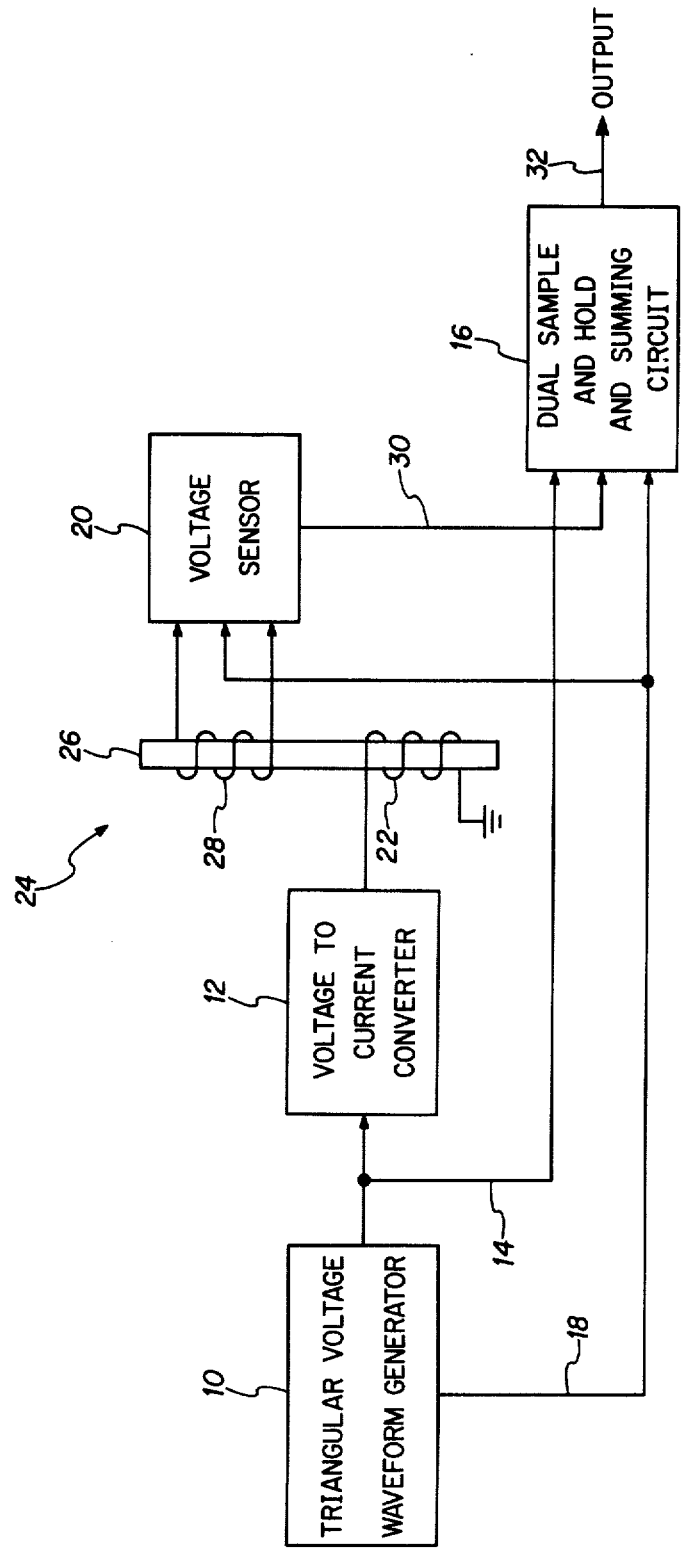
FIG. 1 is a block diagram of the inventive concept.
Figure 2:
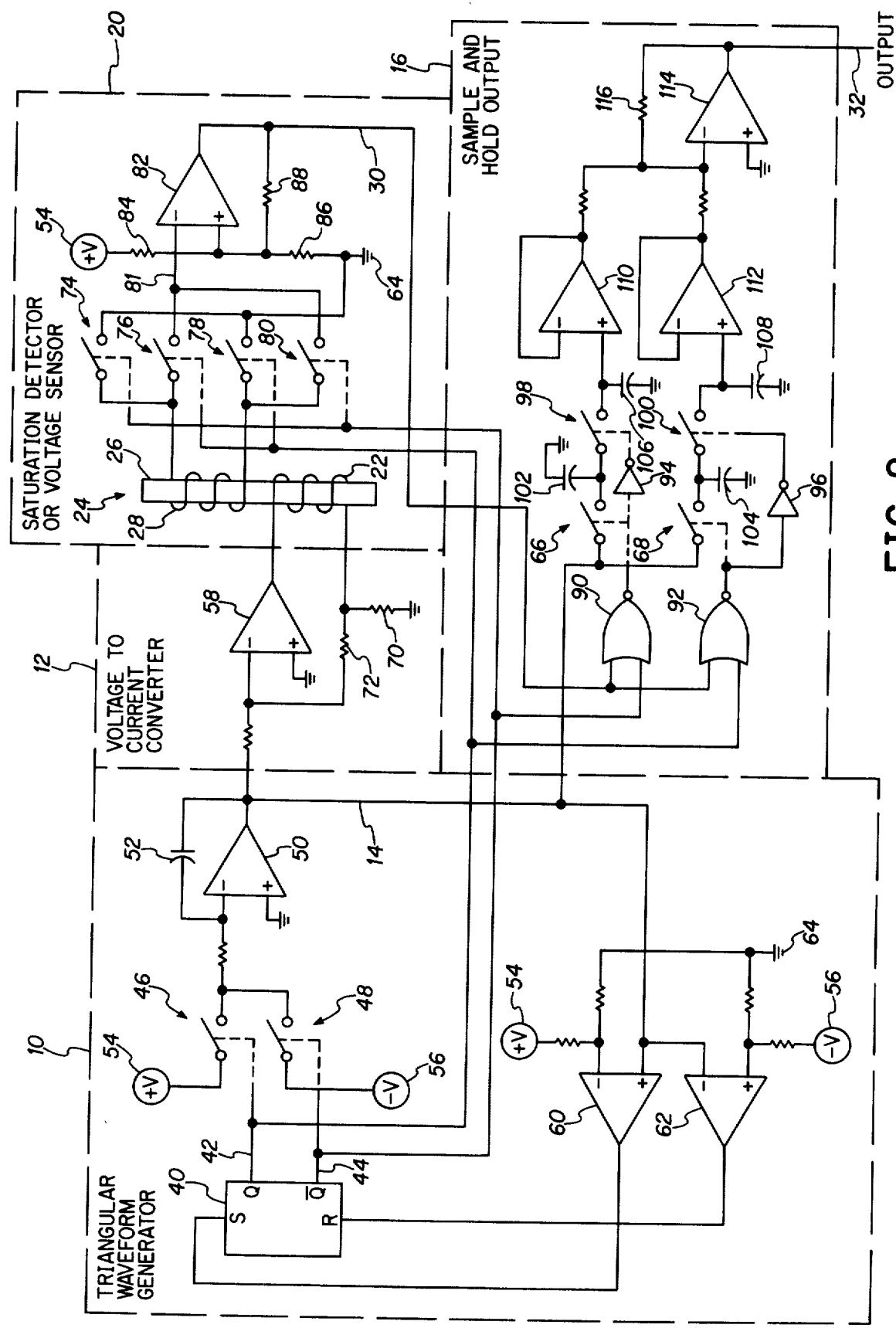
FIG. 2 is a schematic diagram providing more details of the block diagram of FIG. 1.

In FIG. 1 a triangular voltage waveform generator 10 supplies signals to a voltage-to-current converter 12 on a lead 14 and also supplies the same signals to a dual sample and hold and summing circuit 16. On a further lead 18, waveform generator 10 supplies further signals to the dual sample and hold circuit 16 as well as supplying signals to a voltage sensor 20. An output of voltage-to-current converter 12 supplies signals to a winding 22 which comprises part of a magnetic sensor 24 having a magnetic rod core 26 and a further winding 28. Winding 28 is connected to supply signals to voltage sensor 20. An output of voltage sensor 20 is supplied on a lead 30 to the dual sample and hold and summing circuit 16. An output of summing circuit 16 is obtained on a leads 32 for providing output signals which are indicative of a magnetic field being sensed.

Where appropriate, the same numbers or designations have been used in FIG. 2 as are used in FIG. 1. Within voltage waveform generator 10, there is a flip-flop 40 having Q and $\bar{Q}$ outputs appearing on leads 42 and 44. The leads 42 and 44 are substantially identical to those designated as 18 in FIG. 1. These leads are connected to a set of switches 46 and 48 respectively which supply signals in a summed condition to an operational amplifier 50 having a capacitor 52 in a feedback position such that it forms an integrator. The switches 46 and 48 are also connected to positive and negative voltage sources 54 and 56 respectively. An output of operational amplifier 50 in integrating square-wave input signals from the switches 46 and 48 provides a triangular waveform output on a lead 14 which is supplied to a further operational amplifier 58 in the voltage-to-current converter 12. These signals are also supplied in a form of feedback to a pair of operational amplifiers 60 and 62 and are connected to their non-inverting and inverting inputs respectively as shown. The remaining inputs to these operational amplifiers are connected to power sources 54 and 56 through a voltage dividing network which is connected in each case to ground 64. The output of operational amplifier 60 is supplied to the set input of flip-flop 40 while the output of operational amplifier 62 is connected to the reset input of flip-flop 40. Lead 14 is also connected to supply input signals to a switch 66 and to a switch 68. The output of operational amplifier 58 in voltage-to-current converter 12 is supplied to the winding 22 within voltage sensor 20. The other end of winding 22 is connected through a voltage dividing pair of resistors 70 and 72 as shown to provide feedback signals to the operational amplifier 58. The winding 28 of sensor 24 is connected to supply signals to a set of switches 74, 76, 78 and 80 which switches are connected in a controlled manner to the leads 42 and 44 for operation thereof. The outputs of these switches are connected to supply input signals between ground and an inverting input of an operational amplifier 82 having its non-inverting input connected to a voltage divider comprising resistors 84 and 86 connected between positive reference potential 54 and ground 64. A resistor 88 is used in a feedback configuration from the output of operational amplifier 82 to the non-inverting input thereof. The output of amplifier 82 is designated 30 and provides input signals to NOR gates 90 and 92 within sample and hold circuit 16. The NOR gates 90 and 92 receive their second inputs from leads 42 and 44 of the triangular waveform generator 10. The outputs of these two NOR gates are used to control switches 66 and 68 and are then inverted by inverters 94 and 96 to control switches 98 and 100. Intermediate the two sets of switches are capacitors 102 and 104 as illustrated. At the output of switches 98 and 100 are further capacitors or storage devices 106 and 108. The outputs of switches 98 and 100 are also connected to non-inverting inputs of amplifiers 110 and 112 (such as may be obtained from National Semiconductor under part number LF 155) respectively each of which has its output connected to the inverting input thereof. These operational amplifiers have their outputs summed and supplied to an inverting input of an operational amplifier 114 having a feedback resistor 116 connected from the output to the inverting input thereof with its non-inverting input connected to ground 64. The output of operational amplifier 114 is the output of the apparatus and is designated 32 as previously illustrated.

Figure 3:
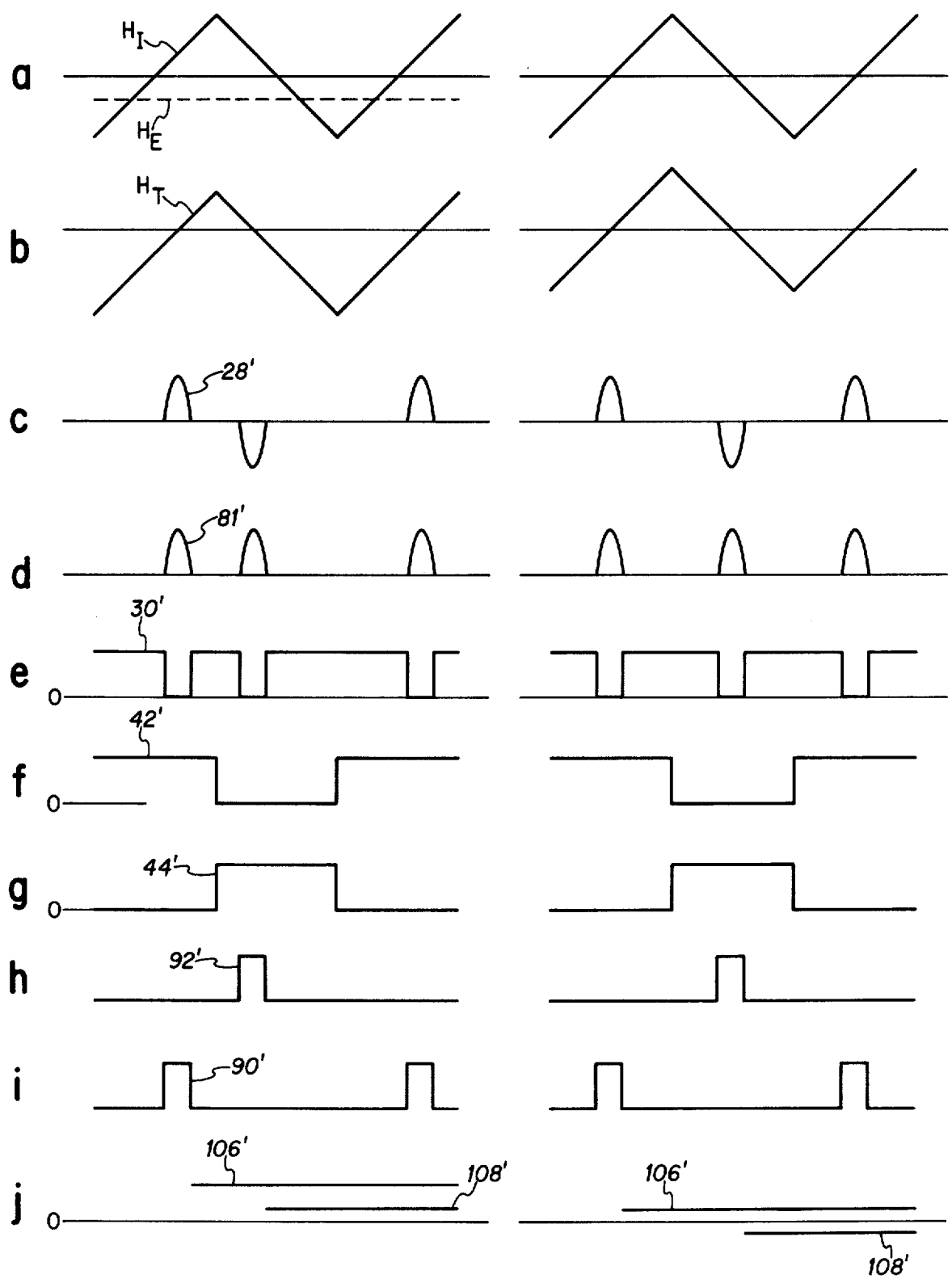
FIGS. 3a-3j comprise a set of waveforms used in explaining the operation of the circuit of FIG. 2.

The waveforms in FIGS. 3a-3j have a '(prime) following the numbers so as to be correlated with the appropriate leads or components in FIG. 2. In other words, the waveforms of FIG. 3c are those appearing at the output of winding 28 while waveforms of 3d illustrate the signals appearing on lead 81 after being passed through a synchronous rectifier or phase detector comprising switches 74 through 80. The waveforms 3e are indicative of the signal appearing at the output of the voltage sensor on lead 30 while waveforms 3f and 3g are the waveforms appearing at the Q and $\bar{Q}$ outputs of flip-flop 40 on leads 42 and 44. Waveforms 3h and 3i are those appearing at the outputs of NOR gates 92 and 90 respectively while the two waveforms in 3j are indicative of the outputs appearing across capacitors 106 and 108 respectively.

OPERATION

The triangular waveform generator 10 of FIG. 1 produces an alternating current signal that has a constant change in voltage or linear change in voltage in one direction and then reverses its slope so as to have a change of voltage at a constant slope in the opposite direction. The peak magnitudes for the wave are equal for both positive and negative values. The output voltage from generator 10 drives the voltage-to-current converter 12. The current produced in the output of current generator 12 has a di/dt proportional to the dv/dt of the voltage output from generator 10. The current through winding 22 will produce a linear change of field intensity in the sensor 24. The voltage then produced in winding 28 will be proportional to the incremental change of the field produced by winding 22 times the incremental permeability of the core. Whenever the voltage across winding 28 drops below a specific value, it is known that the incremental permeability of the core 26 has decreased to an amount below a specific value. Voltage sensor 20 detects when the output from winding 28 has fallen below the given value. Voltage sensor 20 uses this signal and a signal received on line 18 from generator 10 which signal indicates the sign of the di/dt in core 26. A logic combination of these two signals control the dual sample and hold block 16 via signals passed on lead 30. While the sampling by the hold circuit 16 is based on the outputs from generator 10 (lead 14), it is sensed by two different sensing sections as determined by the leads 18 (42 and 44) from waveform generator 10 and at times dictated by the output signal from sensor 20. At the time of sampling, the waveform from the triangular wave voltage generator 10 (on lead 14) is proportional to the field produced by the current in winding 22. During the next half cycle when the current through the winding is in the opposite direction and the voltage sensor senses when the voltage drops below a specific value, the voltage on lead 14 is again sampled to determine the field produced in winding 22 to cause the incremental permeability to drop to the same specific value. The sum of these two held values will then be proportional to the external magnetic field that is affecting the magnetic sensor 24.

FIG. 2 illustrates in more detail a schematic of the circuit where the waveform generator 10 is of the same type as explained in connection with my co-pending application 7260 referenced above. The voltage-to-current converter 12, likewise, is of a standard type that converts voltage to a current source. Saturation detector or voltage sensor circuit 20 combines the logic information of the direction of the change of current in the excitation core winding 22 so as to always produce a positive voltage at the inverting input of amplifier 82 on lead 81. Thus, as long as this voltage is greater than the bias produced by the combination of resistors 84 and 86, the output on lead 30 of comparator 82 will be a logic "0". When the output voltage signal from voltage sensor 20 is a logic "0" and the $\bar{Q}$ signal on lead 44 from the set reset flip-flop 40 of the triangular waveform generator 10 is also a "0", the output from NOR gate 90 will be a logic "1" thereby closing the switch 66 so that the voltage on capacitor 102 will be essentially equal to the voltage on the output of triangular waveform generator 10 at that instant. When the voltage on lead 30 goes positive during this period, the voltage on capacitor 102 will be held and transferred to capacitor 106 due to the action of switch 98 in response to the output of NOR gate 90 going to a logic "0". This logic "0" will be inverted by inverter 94 thus actuating switch 98.

When the current through winding 22 moves in the opposite direction and further when the output on lead 30 from sensor 20 becomes positive, the voltage on the output of triangular waveform generator 10 will be stored on capacitor 104 and then transferred to capacitor 108. The two voltages on the capacitors 106 and 108 of the sample and hold 16 will be summed using the resistors at the outputs of operational amplifiers 110 and 112 to the inverting input of operational amplifier 114. The output on lead 32 will then be proportional to the external field affecting the sensor core or sensing apparatus 24.

FIGS. 3a-3j illustrate two sets of waveforms. The lefthand set of waveforms illustrates when there is an external field $H_E$ and the set of waveforms on the right illustrates the waveforms appearing when there is no external field affecting the sensor 24. As illustrated in waveform 3a of FIG. 3, $H_I$ is the field produced by the current through winding 22. The sum of the two fields $H_I$ and $H_E$ is shown in waveform 3b as $H_T$ or in other words, the total field. The voltage produced in winding 28 is shown in waveform 3c and in turn, the voltage in waveform 3d is that illustrated as being applied to the input to amplifier 82. As illustrated, for the first case, the sampled voltages of waveform 3j for both half cycles of the drive current are positive thus indicating a substantial external field being sensed. On the other hand, the second condition illustrates a balanced condition where there is no external field thus the two sampled voltages as illustrated in waveform 3j are equal and opposite in magnitude and provide a summed output of "0".

In summary then, the operation of the sensor involves the driving of a magnetic core with a selected waveform signal to saturation in both directions. As the core passes from one saturation condition to a second saturation condition, the permeability rises and again drops as it goes to the opposite condition of saturation. Between these two saturation points when the permeability rises, the output winding on the sensor will provide an output signal which when processed by the logic within voltage sensor 20, causes a sampling of the drive voltage twice for each cycle of excitation. The sum of these two drive sampled voltages are then combined to produce an output signal which is indicative of the magnetic field intensity in the direction of the axis of the sensor that is affecting the permeability or saturation characteristics of the sensor.

It will be realized that the present invention can be incorporated in both analog form, as shown, or digital form (not shown) and still practice the inventive concept. Up/down counters, digital-to-analog converter, shift registers and digital summing means may be used in converting the circuit of FIG. 1 to a digital implementation. However, it is believed unnecessary to illustrate the various alternate forms which may be usable to practice the invention. Thus, it is to be understood that the inventive concept includes digital approaches and I wish to be limited only by the scope of the appended claims wherein I claim.

I claim:

1. Apparatus for measuring magnetic field comprising in combination:

magnetic rod sensing means having a large length-to-diameter ratio and including drive and output windings;

triangular waveform drive means, including logic output means, connected to said drive winding for cyclically altering the magnetic field in a linear manner as a function of time between first and second magnetic field values, said logic output means providing output signals indicative of times at which the magnetic field reaches said first and second values; and sample and hold means, connected to said output winding and to said logic output means, for outputting a signal indicative of sensed magnetic field as obtained by taking the average voltage appearing on said drive winding at times determined by signals received from said logic output means.

2. The method of measuring an external magnetic field comprising the steps of:

driving a multiple winding magnetic sensor having a large length-to-diameter ratio with a drive signal such that the magnetic field strength in the sensor cyclically varies in the manner of a triangular waveform;

sensing the voltage output by said sensor at times coincident with the peaks of said triangular waveform; and averaging the sensed voltages to provide a signal indicative of an external field affecting said magnetic sensor.

3. The method of external magnetic field intensity detection comprising the steps of:

periodically and bidirectionally driving a magnetic field direction sensitive magnetic material to saturation using a bipolar drive signal;

detecting flux magnitudes at opposing drive field intensities;

outputting signals indicative of magnitudes of drive signals at times of detected flux magnitudes; and averaging the outputted signals to provide an indication of external magnetic field intensity.

4. Apparatus for measuring an external magnetic field comprising in combination:

multiple winding magnetic sensor means wherein the magnetic portion thereof has a large length-to-diameter ratio;

first means for driving said sensor means with a drive signal, such that the magnitude of the magnetic field in the vicinity of said sensor means varies in the manner of a triangular waveform;

second means for sensing the magnitude of the drive signal to said sensor means at times coincident with saturation of said sensor means; and third means for averaging the sensed drive signal magnitudes to provide an output signal indicative of an external field affecting said magnetic sensor.

* * * * *